United States Patent [19]

Cao et al.

[11] Patent Number: 5,530,401

[45] Date of Patent: Jun. 25, 1996

[54] SINGLE SOURCE DIFFERENTIAL CIRCUIT

[75] Inventors: Tai A. Cao; Satyajit Dutta, both of Austin, Tex.

[73] Assignee: International Business Machines Corporation, Armonk, N.Y.

[21] Appl. No.: 483,906

[22] Filed: Jun. 7, 1995

Related U.S. Application Data

[63] Continuation of Ser. No. 264,121, Jun. 22, 1994.

[51] Int. Cl.$^6$ .............................. H03K 5/153; H03K 5/24
[52] U.S. Cl. .............................. 327/563; 327/72; 327/65; 327/206
[58] Field of Search .................................. 307/494, 496, 307/497, 356, 358, 360, 362, 363, 290; 327/51, 52, 53, 56, 58, 60, 62, 63–66, 68, 70, 72, 74, 76, 77, 78, 79, 80–82, 85, 88, 89, 563, 205–206

[56] References Cited

U.S. PATENT DOCUMENTS

| | | | |
|---|---|---|---|
| 3,873,856 | 3/1975 | Gerlach et al. | 307/279 |
| 3,882,331 | 5/1975 | Sasaki | 307/279 |
| 4,063,119 | 12/1977 | Odell et al. | 307/279 |
| 4,506,168 | 3/1985 | Uya | 307/290 |
| 4,507,795 | 3/1985 | Wagner | 307/358 |
| 4,677,315 | 6/1987 | Blauschild et al. | 307/350 |
| 4,677,388 | 6/1987 | Morrison | 307/358 |
| 4,687,954 | 8/1987 | Yasuda et al. | 307/290 |
| 4,733,107 | 3/1988 | O'Shaughnessy et al. | 307/290 |
| 4,749,954 | 6/1988 | Hayano | 327/68 |
| 4,885,479 | 12/1989 | Oritani | 307/443 |
| 5,017,805 | 5/1991 | Kase | 307/497 |
| 5,034,623 | 7/1991 | McAdams | 307/290 |
| 5,182,480 | 1/1993 | Goto | 327/72 |
| 5,274,273 | 12/1993 | Baginski et al. | 307/494 |
| 5,302,871 | 4/1994 | Matsuzaki et al. | 307/603 |

OTHER PUBLICATIONS

*McGraw–Hill Book Company*, D. L. Schilling et al, Electronic Circuits Discrete and Integrated, Second Edition, "Multiple–Transistor Circuits", Chapter Seven, pp. 304–324.

*Primary Examiner*—Timothy P. Callahan
*Assistant Examiner*—Eunja Shin
*Attorney, Agent, or Firm*—Mark E. McBurney

[57] ABSTRACT

A circuit for supplying a reference voltage from a single data input voltage source is provided which utilizes a delay circuit in conjunction with a source follower circuit to provide a separate reference voltage to a differential circuit. The data input signal is provided concurrently to the source follower circuit and the delay. The source follower circuit includes an "N" type transistor which has its source connected to the source of a "P" type transistor. The delay circuit is provided to delay, or "hold off" the data input signal until the signal is through the source follower and ready for input to the differential circuit. By using the delay, the data input signal and the reference signal (output from the source follower) are input to the differential circuit simultaneously. The threshold voltage drop across the gate and source of the transistors in the source follower circuit provide the reference voltage, which follows the data input voltage. In this manner, hysterisis induced by the source follower circuit provides a reference voltage which can be used by a differential circuit, or the like and eliminate the need for two separate and distinct power supplies.

7 Claims, 3 Drawing Sheets

SINGLE SOURCE DIFFERENTIAL CIRCUIT

This is a continuation of application Ser. No. 08/264,121 filed Jun. 22, 1994.

BACKGROUND OF THE INVENTION

1. Field of the Invention

The present invention relates to an integrated circuit which induces hysterisis in order to generate a reference voltage. More specifically, an input signal is used to provide a first voltage to a circuit, such as a driver or receiver circuit. The first voltage is also manipulated to create a second voltage which is used by the circuit as a reference.

2. Description of Related Art

Many circuits exist which require more than a single input in order to operate correctly. For example, differential amplifiers are well known and commonly used as driver or receiver circuits in computer systems employing integrated circuit (IC) technology.

Differential amplifiers are basic circuits which by their very nature require that a "difference" in signals be present which varies over time. This difference is then used to provide a reference by which an output signal can be provided which is proportional to the difference.

Typically, a first voltage input is received by the differential amplifier circuit which is considered to be an input digital signal, i.e. a specific voltage or the absence of a voltage (the presence of a voltage indicates logical "1" and the absence of voltage indicates logical "0"). An absence of a voltage may mean a particular reference voltage and is not intended to mean a floating voltage which may occur when there is no connection, or no input coming in. A second voltage input is also required as a reference. Conventional circuits use a separate voltage source which is provided by an independent and distinct power supply.

An ordinary complementary metal oxide semiconductor (CMOS) differential circuit has a very small hysterisis bandwidth, about 200 millivolts around the point where the voltage equals Vdd/2. There are two main reasons. First, the reference voltage stays constant (usually at Vdd/2) and second, only a few hundred millivolts on either side of the reference voltage of the input will switch the circuit. Furthermore, conventional differential circuits need a separate circuit line, or rail, at a different potential to be used as a reference. At very high speed operations, e.g. greater than 100 MHz noise (e.g. crosstalk, reflections, and the like) increases. For some off-chip networks, particularly multi-drop nets, the relatively small hysterisis band width of 200 mV is not large enough. When the differential circuit is used as a receiver in unterminated far-end transmission line, fault switching may occur at receivers on the near-end of the transmission line. Further, because of high wiring density of multichip modules (MCM) it is difficult for another line, or rail having a different potential to be fabricated in the MCM, due to the need to minimize the footprint of the module.

FIG. 1 is a typical prior art differential amplifier as shown generally by reference numeral 1. It can be seen that a first voltage $v_1$ is provided by power supply 3 and a second voltage $v_2$ is provided by a second power supply 5. A voltage differential is then output across $v_{o1}$ and $v_{o2}$. The actual operation of a differential amplifier is well known in the art and will not be described further. See "Electronic Circuits; Discrete and Integrated", second edition, D. L. Schilling and C. Belove, McGraw-Hill, 1979, pps. 304–324. Those skilled in the art will readily comprehend why it would be advantageous to have a circuit that could provide an input voltage and a reference voltage from a single source, without the necessity of separate and distinct power supplies, as disclosed by the prior art systems.

SUMMARY OF THE INVENTION

In contrast to the prior art, the present invention provides a circuit for supplying a reference voltage from a single data input voltage source.

Broadly, the present invention utilizes a delay circuit in conjunction with a source follower circuit to provide a separate reference voltage to a differential circuit. The data input signal is provided concurrently to the source follower circuit and the delay. The source follower circuit includes an N type transistor which has its source connected to the source of a P type transistor. The delay circuit is provided to delay, or "hold off" the data input signal until the signal is through the source follower and ready for input to the differential circuit. By using the delay, the data input signal and the reference signal (output from the source follower) are input to the differential circuit simultaneously. The threshold voltage drop across the gate and source of the transistors in the source follower circuit provides the reference voltage, which follows the data input voltage. In this manner, hysterisis induced by the source follower circuit provides a reference voltage which can be used by a differential circuit, or the like and eliminates the need for two separate and distinct power supplies.

Once input to the differential circuit, the data input and reference are compared and the output of the differential circuit is then inverted and information (based on the difference between the input and reference signal) can be provided to another circuit and/or amplified.

Therefore, in accordance with the previous summary, objects, features and advantages of the present invention will become apparent to one skilled in the art from the subsequent description and the appended claims taken in conjunction with the accompanying drawings.

DETAILED DESCRIPTION OF THE PREFERRED EMBODIMENTS

As stated previously, differential circuits are widely used as drivers and receivers in the integrated circuits which comprise computer systems. More particularly, a differential circuit will receive a signal as a data input voltage from another circuit on the same or a different computer chip. Also, the differential circuit may be considered a driver circuit which will output a signal to another circuit (receiver) on the same or another chip. Thus, the same differential circuit can be used as either a driver or receiver, depending on the particular application. Therefore, the importance of this type of circuit can be seen. Further, those skilled in the art will understand how providing a separate and distinct power supply for both inputs to a differential circuit require a great deal of additional circuitry to be provided on the integrated circuit. For example, at least one additional line in, or rail will be required to provide a second separate voltage to the differential circuit.

Figure 1:
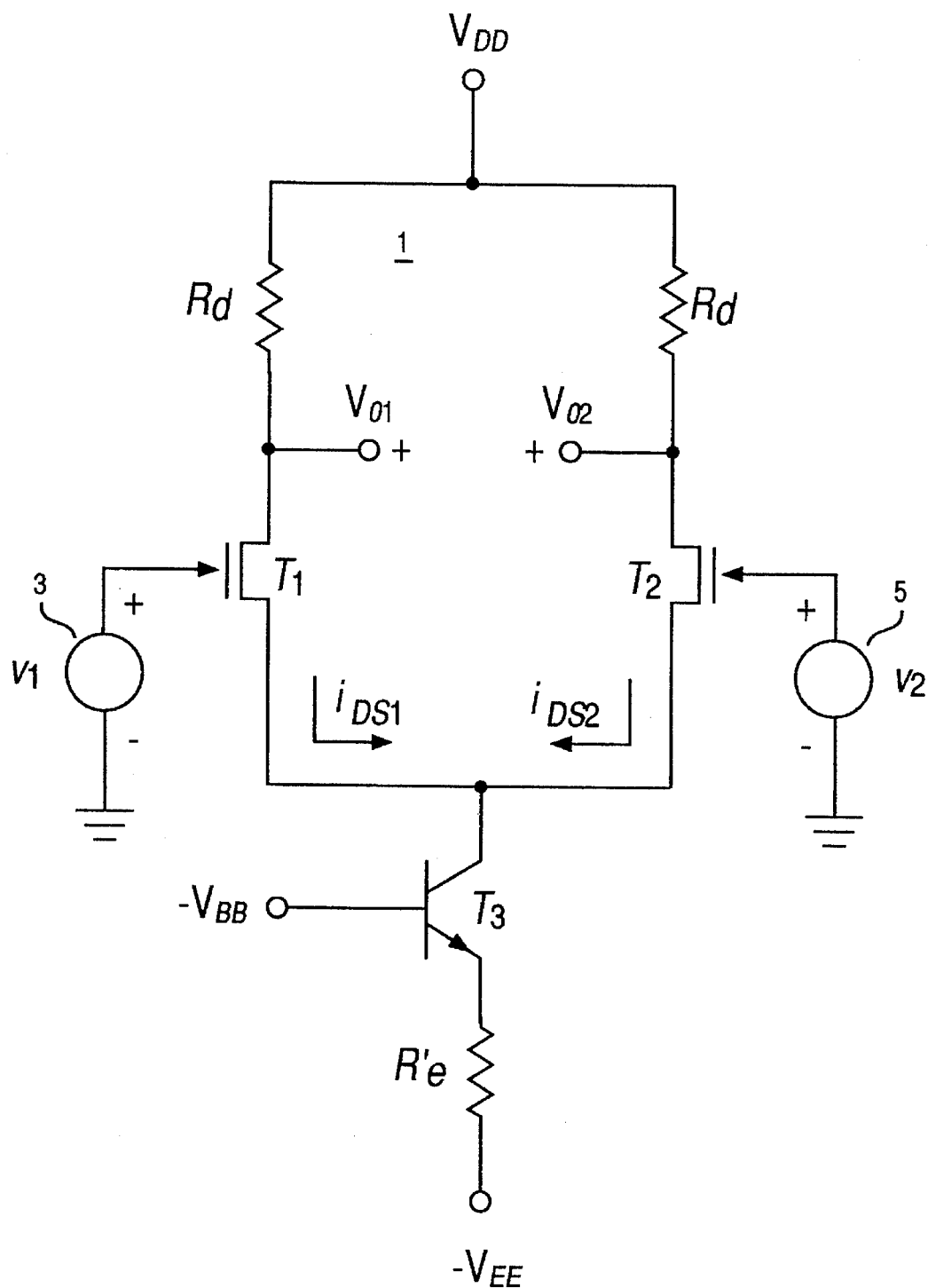
FIG. 1 is a prior art circuit illustrating the conventional practice of providing separate sources for input voltage and reference voltage.
Figure 2:
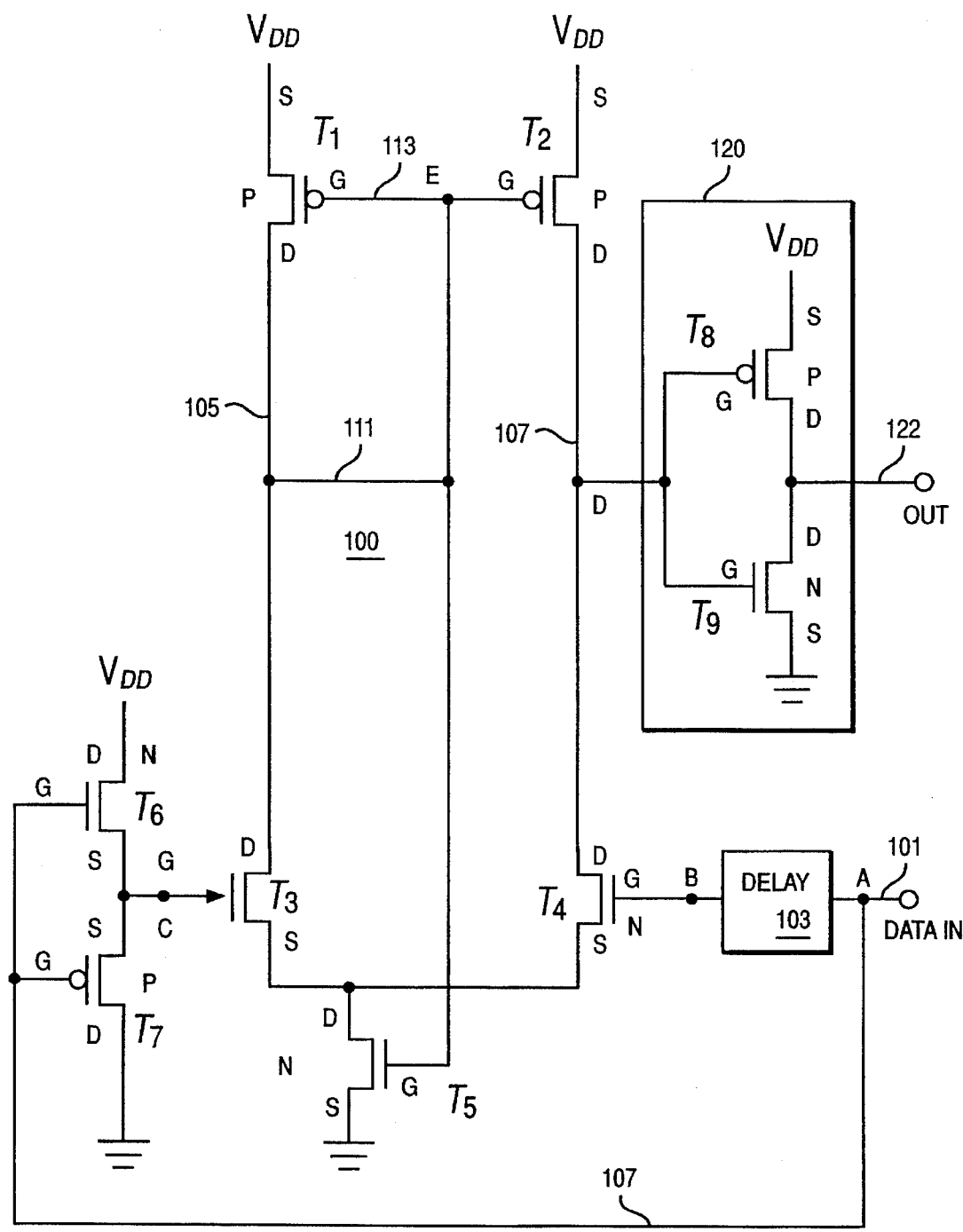
FIG. 2 is a diagram showing the circuit of the present invention wherein induced hysterisis allows the input voltage to also be used to drive the reference voltage.

To vary the reference voltage in the same direction with respect to the input signal is one way to increase the bandwidth of the hysterisis curve. To achieve this type of reference voltage variation, a non-inverting low-swing buffer is used. This buffer is shown in FIG. 2 as transistors T6 and T7. The buffer consists of NFET device (T6) which has its drain connected to Vdd, and a PFET device (T7) which has its drain connected to ground. Because T6 cannot conduct logic "1" well and T7 cannot conduct logic "0" well, the buffer output never reaches either Vdd or ground potential. The output swings somewhere between Vdd and ground. This reduced voltage swing will ensure that a receiver circuit switches when an input exceeds the reference voltage (absolute value) in either a rising or falling transition.

The hysterisis curve can be controlled by changing the levels of voltage swing. The size of devices T6 and T7 of the non-inverting buffer determine the swing. The change in the levels of voltage swing in turn determines the graphical center of the swing such that the hysterisis curve can be moved to the right or left relative to the voltage of the input signal. A preferred embodiment also includes a delay circuit which will allow the reference voltage output by the non-inverting buffers (circuit including T6 and T7) additional time to reach higher in a rising transition and lower in a falling transition. In this case the input voltage works against a stronger reference voltage and the hysterisis curve is widened. Briefly, when an input signal includes a rising transition, the reference voltage is initially higher than the delayed input and the output of the receiver is at a low level. As the input rises, the non-inverting buffer output also rises. When the delayed input exceeds the buffer, or reference voltage which is at a certain level, the receiver switches from low to high. The certain voltage at which the circuit switches is determined by the sizes of the devices in the circuit. Similarly, the falling switching threshold should be lower than the rising switching threshold to ensure that an appropriate amount of hysterisis has been generated.

The present invention will now be described in greater detail with reference to FIG. 2, wherein reference numeral 100 represents a differential circuit having transistors T1, T2 and T5 which provide a constant current circuit. Transistors T3 and T4 form the inputs to differential circuit 100. Transistors T3, T4 and T5 are each N-channel transistors which will be turned on when a voltage is present. In the case of T5, a voltage will always be provided on the gate such that T5 is always turned on and will provide a constant current source to the source connections of transistors T3 and T4. These transistors are where the input voltages are received by the differential circuit 100. Data input line 101 provides a voltage signal representing either a logical 1 or logical zero depending on the presence or absence of a voltage. The data input signal is provided to delay circuit 103 and concurrently to N-channel transistor T6 and P-channel transistor T7. In a preferred embodiment delay circuit 103 is an even number of inverter circuits connected in series. Thus, the input is equivalent to the output, but a delay exists from the time the data signal is input to delay 103 (point A) and the time at which the signal exits (point B) and is input to T4. This time delay can be equal to or greater than the time required for the data input signal to be transformed into a reference voltage by the source follower circuit which consists of transistors T6 and T7. Transistor T6 is an N-channel transistor with the input signal received at its gate and the device voltage Vdd connected to the drain. Transistor T7 is a P-channel device with its drain connected to ground and the data input received at its gate. The source connections for both T6 and T7 are tied together and connected to the gate of transistor T3.

The P-channel load devices T1 and T2 form the current bias configuration wherein T1 is the diode-connected device. The mirror node "E" provides biasing of the current source device T5. The signal appearing at point "E" is the one that drives both the load device T2 and the current source device T5 to enhance the gain of the output of the differential circuit 100. Transistors T1 and T2 are both P-channel type devices and along with T5, which is an N-channel device, are connected as a current mirror circuit. These transistors are turned on when there is no voltage present at their gate, and turned off when a voltage is present. In the circuit shown by FIG. 2, transistors T1 and T2 have their gates connected together, via circuit line 113. Further, T1 has its gate and source connections tied together by line 111. Thus, T1 is connected as a diode which allows current to flow in only one direction, i.e. from T5 through line 105. The device voltage Vdd is connected at the source of transistors T1 and T2. In this manner, when the transistors are turned off, identical impedance is presented to Vdd such that the same current will flow from T5 through T3 and T4 (when they are turned on) and between the drain to the source of transistors T1 and T2, through circuit lines 105 and 107.

By connecting transistors T1, T2 and T5 in this manner, there will be a constant current source, since the gate of T5 is connected by line 111 to line 105, which will always have a voltage present (as discussed below). Since T5 is an "N" device it will be on when a voltage is present at its gate, thus allowing current to flow from the source to the drain of T5.

Figure 3:
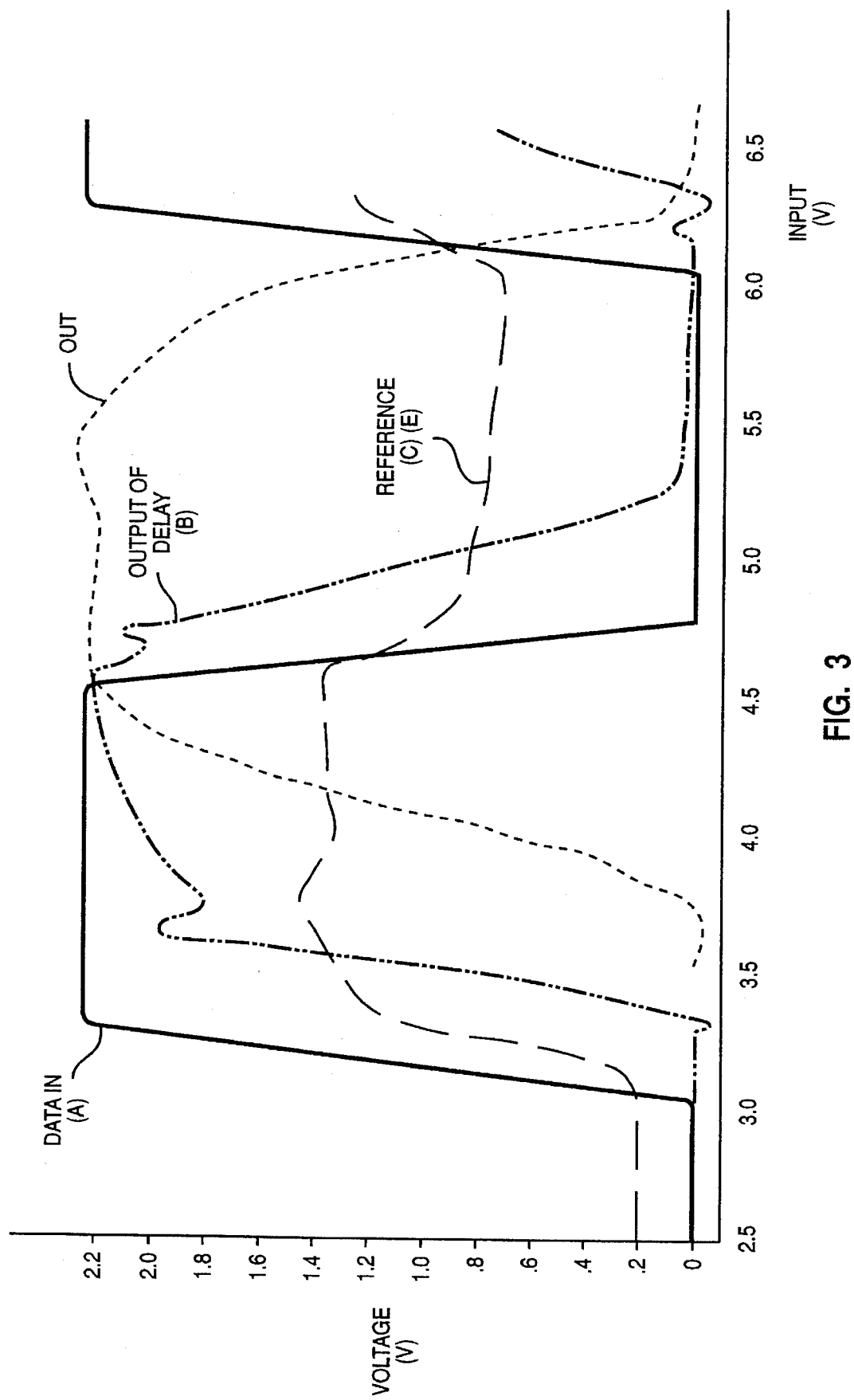
FIG. 3 is a graph showing the voltage waveforms at various points in the circuit of FIG. 2.

The operation of the present invention will now be explained in conjunction with FIGS. 2 and 3. A data signal is input at point "A" which is essentially a square wave having an amplitude equal to the device voltage Vdd. In a preferred embodiment Vdd equals +2.25 volts, however, many other voltages, such as +5 volts, are contemplated by the present invention. The square wave input varies from 0 to +2.25 volts, wherein 0 volts (absence of voltage) indicates a logical "0" and +2.25 volts (presence of a voltage) indicates a logical "1". The data input signal at "A" is shown in FIG. 3 and labelled as "Data In". This data input is simultaneously provided to delay 103 and to transistors T6 and T7 along circuit line 109. As noted above delay 103 is an even number inverters which cause a time delay as the input signal is varied in accordance therewith. A waveform, "Output of Delay" is shown in FIG. 3 as the signal which emerges from delay 103 at point "B".

Next, the operation of transistors T6 and T7 will be described. When the data input signal provided on line 109 is positive, e.g. equal to +2.25 volts, then T6 is turned on since it is an "N" type transistor. This causes a threshold voltage to be present across the gate and source (Vgs). This threshold voltage drop is present across the gate and source of T6 such that the voltage present at point "C" of FIG. 2 is less than Vdd (+2.25 volts in this example). It should be noted that complementary metal oxide semiconductor (CMOS) circuits will switch at a voltage level equal to Vdd/2. In a preferred embodiment the transistors T3, T6 and T7 are sized to ensure that T3 will be turned on by a threshold voltage (Vgs) approximately equal to +1.4 volts (when Vdd=2.25 volts). This T6 rising threshold voltage Vgs is the reference voltage utilized by the present invention as an input to differential circuit 100. FIG. 3 illustrates the shape of the waveform of the reference voltage and point "C" of FIG. 2.

This positive voltage (Vgs of T6) is then placed on the gate of transistor T3, which is also an "N" type transistor. Concurrently, the positive voltage Vdd is placed on the gate of T4, which is also an "N" device and T4 is then turned on. Since the gate voltage of T4 is greater than the gate voltage of T3, current will flow through the circuit leg comprised of transistors T2 and T4, instead of the circuit leg which includes T1 and T3. Therefore, electrically speaking transistor T4 is on and transistor T3 is off. Transistor T3 is electrically connected to point "E", which will be at some positive voltage to turn on transistor T5.

Subsequent to the data input signal being a positive voltage, it becomes zero voltage due to the falling edge of the square wave. At this time, the signal is provided to delay 103 (as previously discussed) and simultaneously along line 109 to T7, which is a "P" type device, such that it is turned on when zero voltage is present on its gate. This causes a falling threshold voltage (Vgs for T7) to be present across the gate and source of T7. This transistor is sized such that a potential difference of approximately +0.6 volts will be present. Further, transistor T3, which is an "N" type device is sized in order to be turned on when +0.6 volts is present on its gate. Thus, current is allowed to flow from T5 through T3 and circuit line 105 to point "E". At the same time, transistor T4 is turned off, since it is an "N" device and zero volts have been placed on its gate, and the gate voltage of transistor T3 is higher than the gate voltage of transistor T4.

Further, FIG. 2 includes an inverter circuit 120 which includes transistors T8 and T9. When a voltage is present at point "D" T9 is turned on and the N-channel conducts current. However, since the source is connected to ground, there is no voltage is present on output line 122. Conversely, when zero volts are present at point "D", the T8 is turned on and its P-channel conducts current placing Vdd (less the voltage drop across the source and drain of T8) on output line 122. An inverter is used in driver circuits to enable the corresponding receiver circuits to detect that the circuit has switched.

Therefore, it can be seen by the illustrative embodiment of the present invention that a single data input signal can be utilized to provide a reference signal for use in a differential circuit utilized in a computer system as a driver or receiver. The transistors T6 and T7 generate hysterisis by having T6 switch on when Vdd is present and T7 switch on at zero volts.

Although certain preferred embodiments have been shown and described it should be understood that many changes and modifications may be made therein without departing from the scope of the appended claims.

We claim:

1. A circuit, comprising:
    a differential circuit for outputting a signal based upon first and second input signals including a first circuit for receiving a data signal having a high and a low level as said first input signal;
    a signal line for providing said data signal to a second circuit, separate from said differential circuit; and
    means, within said second circuit, for generating a reference signal, based upon said data signal, and for providing said reference signal as said second input signal to said differential circuit, said second circuit including an N-channel device that outputs a high level of said reference signal which is less than said high level of said data signal, when said high level of said data signal is input thereto, said second circuit also includes a P-channel device for outputting a low level of said reference signal which is greater than said low level of said data signal;
    wherein said reference signal is at a voltage different from said data signal and a ground voltage signal, and wherein a single voltage source provides said data signal, said reference signal and said ground voltage signal.

2. A circuit according to claim 1 wherein said second circuit generates said reference signal by inducing hysteresis.

3. A circuit according to claim 2 further comprising delay circuit means for ensuring that said data signal and said reference signal are input to said first differential circuit simultaneously.

4. A circuit according to claim 3 wherein said delay circuit is an even number of interconnected inverter circuits.

5. A method, comprising the steps of:
    providing a differential circuit for outputting a signal based upon first and second input signals;
    receiving, by a first circuit included in said differential circuit, a data signal having a high level and a low level as said first input signal to said differential circuit;
    providing said data signal to a second circuit, different from said differential circuit; and
    generating, by said second circuit, a reference signal, based upon said data signal, and providing said reference signal as said second input signal to said differential circuit, said second circuit including an N-channel device that outputs a high level of said reference signal which is less than said high level of said data signal, when said high level of said data signal is input thereto, said second circuit also includes a P-channel device for outputting a low level of said reference signal which is greater than said low level of said data signal, when said low level of said data signal is input thereto;
    wherein said reference signal is at a voltage different from said data signal and a ground voltage signal, and wherein a single voltage source provides said data signal, said reference signal and said ground voltage signal.

6. A method according to claim 5 wherein said step of generating comprises the step of inducing hysteresis.

7. A method according to claim 6 further comprising the step of delaying the receipt of said data signal to ensure that said data signal and said reference signal are input to said differential circuit simultaneously.

\* \* \* \* \*